United States Patent [19]

Schönberger et al.

[11] Patent Number: 5,468,909

[45] Date of Patent: Nov. 21, 1995

[54] INSULATING PART WITH IMPROVED HEAT TRANSFER ELEMENT

[75] Inventors: Eduard Schönberger; Stefan Gruber, both of Kümmersbruck; Hermann Kasowski, Kastl; Heinz Schmidt, Kümmersbruck, all of Germany

[73] Assignee: Siemens Aktiensesellschaft, Munich, Germany

[21] Appl. No.: 184,614

[22] Filed: Jan. 21, 1994

[30]     Foreign Application Priority Data

Jan. 22, 1993 [DE]  Germany .............................. 9300864 U

[51] Int. Cl.⁶ ........................................................ H05K 7/20
[52] U.S. Cl. ...................... 174/16.1; 174/16.3; 361/705; 361/707; 361/719; 361/720
[58] Field of Search ................................ 174/16.1, 16.3; 361/704, 705, 707, 719, 720

[56]                References Cited

U.S. PATENT DOCUMENTS

| | | |
|---|---|---|
| 3,211,822 | 10/1965 | Krall et al. . |
| 4,256,792 | 3/1981 | Koepke et al. ........................... 428/119 |
| 4,829,403 | 5/1989 | Harding .................................. 361/386 |
| 4,879,630 | 11/1989 | Boucard et al. ......................... 361/386 |
| 5,113,315 | 5/1992 | Capp ....................................... 174/16.3 |
| 5,253,144 | 10/1993 | Schonberger et al. .................... 36/736 |
| 5,270,902 | 12/1993 | Bellar et al. ............................. 361/718 |
| 5,280,409 | 1/1994 | Selna et al. .............................. 361/720 |
| 5,282,111 | 1/1994 | Hopfer .................................... 361/704 |
| 5,285,352 | 2/1994 | Pastore et al. ........................... 361/707 |
| 5,299,091 | 3/1994 | Hoshi et al. ............................. 361/723 |

FOREIGN PATENT DOCUMENTS

| | | |
|---|---|---|
| 0306412 | 3/1989 | European Pat. Off. . |
| 0465693 | 1/1992 | European Pat. Off. . |
| 0465692 | 1/1992 | European Pat. Off. . |
| 4-279097 | 10/1992 | Japan ...................................... 361/720 |

OTHER PUBLICATIONS

Cherniack, G. B. et al; "Microcircuit Heat Sink"; IBM Technical Bulletin 3–66; vol. 8 No. 10; Mar. 1966; p. 1457.

*Primary Examiner*—Morris H. Nimmo
*Attorney, Agent, or Firm*—Kenyon & Kenyon

[57]                ABSTRACT

An insulating part for an electronic device includes a first metallized outer surface capable of cooling one or more electronic components disposed on the insulating part. The insulating part also includes one or more additional metallized outer surfaces, such as a set of cooling ribs, to provide improved cooling for the electronic components. These additional outer surfaces are coupled electrically and thermally to the first metallized outer surface, and to each other by recesses containing a heat transfer element, such as a metallization or a soldered connection. Thus, heat transferred to the first outer surface is further dissipated among the several additional cooling surfaces.

23 Claims, 1 Drawing Sheet

5,468,909

INSULATING PART WITH IMPROVED HEAT TRANSFER ELEMENT

BACKGROUND OF THE INVENTION

The present invention relates to the field of insulating parts for electronic devices, and in particular to an insulating part having an improved element for transferring heat to a cooling element. Such insulating parts are commonly injection-molded from plastic as a single-piece, and generally have at least one metallized outer surface acting as a cooling surface and printed conductors arranged on the insulating part for electroconductively connecting various electronic components. An insulating part of this type is disclosed, for example, by European Patent EP-0 465 693 A1. Parts of this type have a variety of applications; for instance, the insulating part may be used as a rear panel for a housing of a programmable controller, such as in the "SIMATIC S5-95 U" manufactured by "SIEMENS AG."

It is well-known in the art of electronics to use an outer surface of a device as a cooling surface for the electronic components of the device. Manufacturing and design constraints often dictate that such a cooling surface be located at a distance from the electronic components to be cooled. Such a remote arrangement, however, makes it difficult to ensure that the electronic components will be effectively cooled.

One approach to the problem created by distancing the cooling surface from the components to be cooled is to provide an integral heat sink proximate to the components and thermally coupled to the cooling surface. Such an approach is disclosed in the U.S. patent application titled "Insulating Part with Integral Cooling Element," filed by the same inventors and on the same day as the present application, the specification of which is incorporated by reference into the present application. Another approach, which may be applied separately or in conjunction with the approach of the incorporated application, is provided by the insulating part of the present invention.

SUMMARY OF THE INVENTION

The present invention provides an insulating part with an improved heat transfer element for transferring heat from an electronic component to a cooling surface. An embodiment of the insulating part includes a single-piece injection-molded plastic part with at least one recessed portion containing a heat transfer element to electrically and thermally couple a first cooling surface and one or more additional cooling surfaces.

In a preferred embodiment, the additional cooling surfaces are part of a cooling rib. The recessed portion may then be arranged either at the base of the cooling rib or within the cooling rib itself. A configuration at the base of the cooling rib is especially advantageous when the waste heat is to be dissipated over several cooling ribs. The recessed portion may be filled either partially or completely by the heat transfer element, with the heat transfer element constructed either as a metallization of the recessed portion or as a soldered connection.

DETAILED DESCRIPTION

Figure 1:
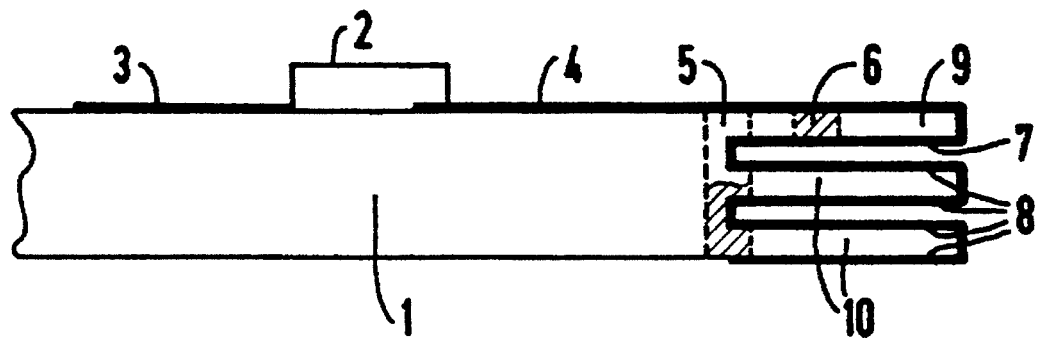
FIG. 1 is a front view of an embodiment of an insulating part with the improved heat transfer element of the present invention.
Figure 2:
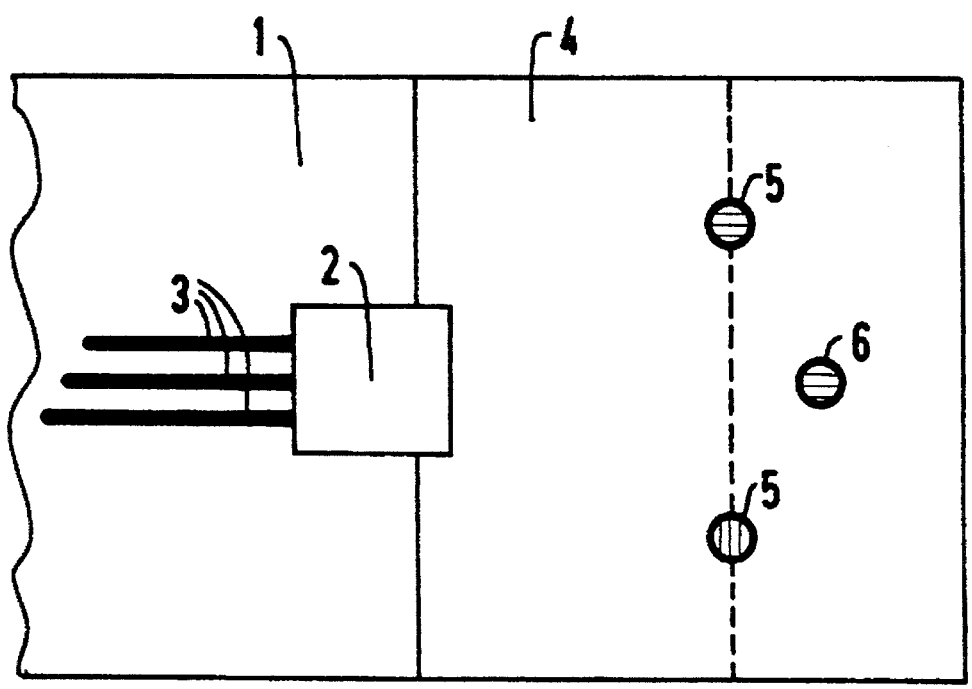
FIG. 2 is a top view of the embodiment shown in FIG. 1.

FIG. 1 and FIG. 2 show front and top views, respectively, of an embodiment of an insulating part according to the present invention. The embodiment comprises an injection-molded part 1 designed as a circuit substrate fitted with a plurality of electronic components (only a single such component 2 is shown) which are electroconductively connected to one another through conductors 3. The conductors 3 may be formed, for example, after the injection molding operation by metallizing the injection-molded part 1 over a large area and then removing the metal layer between the printed conductors 3.

The electronic component 2 of this embodiment is a power-generating element that must be cooled during operation. As is known in the art, the waste heat from the electronic component 2 is dissipated through the metallized surface 4. Under certain conditions, however, the metallized surface 4 will not be able to provide sufficient cooling for the component 2. It is therefore desirable to provide additional cooling surfaces to supplement the cooling ability of the metallized surface 4. For that reason, the injection-molded part 1 of the present invention includes additional outer surfaces 7, 8 and recesses 5, 6. The recesses 5, 6 are metallized on their interior, thus providing a heat transfer element to connect the metallized surface 4 through thermal and electrical conductivity to the additional outer surfaces 7, 8. The additional outer surfaces 7, 8 are also metallized, and therefore act as additional cooling surfaces. Both the additional outer surfaces 7, 8 and the recesses 5, 6 may be coated along with the injection-molded part 1 during the metallization process noted above.

The recesses 5, 6 may be metallized so heavily that the metallization causes them to be completely filled, in which case an especially large quantity of heat can be dissipated. Alternatively, the thickness of the metallization may be such that the recesses 5, 6 are only partially filled. The optimum degree of metallization will depend on the level of cooling required for a particular application.

When only a relatively small additional cooling surface is needed, the recess 6 is preferably disposed in a single additional cooling surface 9. On the other hand, where a large additional cooling surface is required the injection-molded part 1 preferably includes several additional cooling surfaces 9, 10, or cooling ribs, having metallized outer surfaces 4, 7, 8. These metallized outer surfaces 4, 7, 8 are thermally and electroconductively connected through the recesses 5 arranged at the base of the additional cooling surfaces 9, 10.

In the exemplary embodiment of FIGS. 1 and 2, heat transfer between the metallized surface 4 and the cooling surfaces 9, 10 is accomplished through the metallizations of the recesses 5, 6. Other means of transferring heat may also be used; for example, soldered connections could replace the metallizations. In such a case, the recesses 5, 6 would be completely filled by the soldered connections.

While the preferred embodiment described above is an injection-molded plastic part, other types of insulating parts may also employ the improved cooling features of the present invention. For example, the insulating part could be a single-piece circuit substrate die-cast from aluminum and suitably anodized over its entire surface, thereby providing the desired electrical insulation properties.

Although the present invention has been described with reference to specific embodiments, it will be apparent to those skilled in the art that many modifications and variations are possible. Accordingly, the present invention embraces all alternatives, modifications and variations that fall within the spirit and scope of the appended claims, as well as all equivalents thereof.

What is claimed is:

1. An insulating part for an electronic device, comprising a first cooling surface electrically and thermally coupled to an electronic component of the device, one or more additional cooling surfaces, and a heat transfer element electrically and thermally coupling said first cooling surface and said one or more additional cooling surfaces, wherein said heat transfer element is arranged in a recessed portion of the insulating part, and said recessed portion is arranged in a base portion of said one or more additional cooling surfaces.

2. The insulating part of claim 1, wherein said recessed portion is completely filled by said heat transfer element.

3. The insulating part of claim 1, wherein said heat transfer element comprises a soldered connection.

4. The insulating part of claim 1, wherein said recessed portion is partially filled by said heat transfer element.

5. The insulating part of claim 1, wherein said heat transfer element comprises a metallization of said recessed portion.

6. An insulating part for an electronic device, comprising a first cooling surface electrically and thermally coupled to an electronic component of the device, one or more additional cooling surfaces, and a heat transfer element electrically and thermally coupling said first cooling surface and said one or more additional cooling surfaces, wherein said heat transfer element is arranged in a recessed portion of the insulating part and said recessed portion is arranged in a body portion of said one or more additional cooling surfaces.

7. The insulating part of claim 6, wherein said heat transfer element comprises a soldered connection.

8. The insulating part of claim 6, wherein said recessed portion is partially filled by said heat transfer element.

9. The insulating part of claim 6, wherein said heat transfer element comprises a metallization of said recessed portion.

10. A single-piece insulating part for securing a plurality of electronic components of an electronic device, comprising:
    (a) a printed conductor electroconductively for connecting said plurality of electronic components to one another;
    (b) a metallized outer surface for electrically and thermally coupled to at least one of the plurality of electronic components;
    (c) an additional outer surface; and
    (d) a recessed portion electrically and thermally coupling said metallized outer surface and said additional outer surface, said recessed portion including a heat transfer element, wherein said additional outer surface is part of a cooling rib, with said recessed portion arranged in a base portion of said cooling rib.

11. The insulating part of claim 10, wherein said recessed portion is completely filled by said heat transfer element.

12. The insulating part of claim 10, wherein said heat transfer element comprises a soldered connection.

13. The insulating part of claim 10, wherein said heat transfer element comprises a metallization of said recessed portion.

14. The insulating part of claim 10, further comprising an injection-molded plastic part.

15. The insulating part of claim 10 wherein said recessed portion is partially filled by said heat transfer element.

16. The insulating part of claim 10, further comprising a metal part coated with an electrically insulating layer.

17. A single-piece insulating part for securing a plurality of electronic components of an electronic device, comprising:
    (a) a printed conductor electroconductively connecting said plurality of electronic components to one another:
    (b) a metallized outer surface electrically and thermally coupled to at least one of the plurality of electronic components;
    (c) an additional outer surface; and
    (d) a recessed portion electrically and thermally coupling said metallized outer surface and said additional outer surface, said recessed portion including a heat transfer element, wherein said additional outer surface is part of a cooling rib, with said recessed portion arranged in a body of said cooling rib.

18. The insulating part of claim 17, wherein said recessed portion is completely filled by said heat transfer element.

19. The insulating part of claim 17, wherein said heat transfer element comprises a soldered connection.

20. The insulating part of claim 17, wherein said heat transfer element comprises a metallization of said recessed portion.

21. The insulating part of claim 17, wherein said recessed portion is partially filled by said heat transfer element.

22. The insulating part of claim 17, further comprising an injection-molded plastic part.

23. The insulating part of claim 17, further comprising a metal part coated with an electrically insulating layer.

* * * * *